United States Patent [19]

Lawrence et al.

[11] Patent Number: 5,430,866

[45] Date of Patent: Jul. 4, 1995

[54] METHOD AND APPARATUS FOR DERIVING MIRRORED UNIT STATE WHEN RE-INITIALIZING A SYSTEM

[75] Inventors: Kenneth J. Lawrence, Rochester; Michael J. McDermott, Oronoco, both of Minn.

[73] Assignee: International Business Machines Corporation, Armonk, N.Y.

[21] Appl. No.: 224,388

[22] Filed: Apr. 7, 1994

Related U.S. Application Data

[63] Continuation of Ser. No. 522,345, May 11, 1990, abandoned.

[51] Int. Cl.⁶ .............................................. G06F 11/16
[52] U.S. Cl. ..................... 395/575; 395/700; 364/DIG. 1; 364/265; 364/266.5; 364/268; 364/268.3; 364/268.5
[58] Field of Search ............................ 371/10.1, 10.2; 395/575

[56] References Cited

U.S. PATENT DOCUMENTS 4,521,847 6/1985 Ziehm et al. ..................... 364/184

OTHER PUBLICATIONS

System/88 User's Guide IBM Publication No. SC34-0667.
Japanese Patent Laid-open Publication No. 218565/1984, "Operation File Copy Scheme", Fujitsu, K. K., dated Dec. 8, 1984.
Japanese Patent Laid-open Publication No. 139172/1987, "Magnetic Disc Control Unit", NEC, dated Jun. 22, 1987.

Primary Examiner—Kevin A. Kriess
Assistant Examiner—Kakali Chaki
Attorney, Agent, or Firm—Roy W. Truelson; Owen J. Gamon

[57] ABSTRACT

A data processing system having a pair of mirrored storage units maintains a state record of the mirrored pair in system memory. In order to be able to determine state when the system is re-initialized, this state information is also stored on each storage unit of the mirrored pair, and in an alternate location. When the state changes, the operating system writes the new state to those storage units which are still functioning, and to the alternate location. In order to prevent ambiguous situations, only certain defined state transitions are permitted. When the system is re-initialized, it attempts to read the state information stored on the storage units. If either unit can not be read, the system substitutes the state retrieved from the alternate state record for the state that would have been read from the non-responding unit. This pair of states from the two units index an unique entry in a state derivation table containing the resultant state.

16 Claims, 10 Drawing Sheets

DEVICE CONFIGURATION TABLE

| UNIT NUMBER (LOGICAL) | COMMON DATA | | | UNIT 'A' | | | UNIT 'B' | | |
|---|---|---|---|---|---|---|---|---|---|
| | MIRRORED UNIT STATE | MIRRORED FLAG | ADD'L FIELDS | I/O ADDRESS | UNIT SERIAL NUMBER | ADD'L FIELDS | I/O ADDRESS | UNIT SERIAL NUMBER | ADD'L FIELDS |
| 1 | ABOK | 1 | | 030 | 12345 | | 120 | 67890 | |
| 3 | - | 0 | | 031 | 23456 | | - | - | |

FIG. 2

STATE DERIVATION TABLE

| State from Device B or NVRAM | State from Device A or NVRAM | | | | | |
|---|---|---|---|---|---|---|
|  | ABOK | AOK | AOKRB | BOK | BOKRA | UNKWN |
| ABOK | ABOK | AOK | AOKRB | BOK | BOKRA | UNKWN |
| BOK | BOK | AOK | **BOK | * | BOKRA | BOK |
| BOKRA | BOKRA | **AOK | * | *BOK | BOK | BOKRA |
| AOK | * | *AOK | * | * | BOKRA | * |
| AOKRB | AOKRB | AOK | AOKRB | * | * | AOKRB |
| UNKWN | UNKWN | AOK | AOKRB | * | BOKRA | UNKWN |

FIG. 3

METHOD AND APPARATUS FOR DERIVING MIRRORED UNIT STATE WHEN RE-INITIALIZING A SYSTEM

This application is a continuation of application Ser. No. 07/522,345 filed May 11, 1990, now abandoned.

BACKGROUND OF THE INVENTION

The present invention relates to maintaining mirrored copies of computer data in redundant data storage units, and in particular to determining which units contain current data when re-initializing the system.

The extensive data storage needs of modern computer systems require large capacity mass data storage devices. A common storage device is the magnetic disk drive, a complex piece of machinery containing many parts which are susceptible to failure. A typical computer system will contain several such units. As users increase their need for data storage, systems are configured with larger numbers of storage units. The failure of a single storage unit can be a very disruptive event for the system. Many systems are unable to operate until the defective unit is repaired or replaced, and the lost data restored. An increased number of storage units increases the probability that any one unit will fail, leading to system failure. At the same time, computer users are relying more and more on the consistent availability of their systems. It therefore becomes essential to find improved methods of sustaining system operations in the presence of a storage unit failure, and restoring the system to normal operating mode when the failure condition has been corrected.

One method of addressing these problems is known as "mirroring". This method involves maintaining a duplicate set of storage devices, which contains the same data as the original. The duplicate set is available to assume the task of providing data to the system should any unit in the original set fail. A system may have a duplicate set of all stored data ("fully mirrored"), or of some subset of the data ("partially mirrored"). Mirroring is becoming increasingly attractive as computer users demand improved system reliability and availability.

A user with a system containing mirrored storage will expect the utmost in reliability from his storage. Since the essence of mirroring is that if one storage unit fails, another is available to take its place, the system must necessarily be able to operate with only one of a pair of mirrored units functioning. When both units of a mirrored pair are functioning and contain current data, the units are said to be synchronized. If one of a mirrored pair of storage units fails, and the other continues to operate, the data in the failing unit will soon become obsolete. The "failure" of a unit simply means that data can no longer be read from or written to the unit. This could mean that the storage unit itself is not operating, or that some other component of the system, such as an I/O processor, is not functioning. Restoring the failing storage unit to operation may leave the data on the storage medium intact, as when a circuit card containing control logic is replaced.

Because a system may operate when the disk units of a mirrored pair are no longer synchronized, it must know the state of the mirrored pair, i.e., which unit or units contain current data. If the system is powered down for any reason, it must be able to reconstruct the state of its storage units when power is restored and the system re-initializes itself. If a failing storage unit was repaired or replaced while the system was down, upon re-initialization the operating system must be able to ascertain that data contained on the repaired or replaced unit is unreliable, and initiate a process to re-synchronize the units, which brings the data on the repaired or replaced unit current with that on the non-failing (current) unit.

One method of ascertaining the state of a mirrored pair of storage units is to store state information on both units. On re-initialization, the system reads this state information. If both units are functioning and the stored state information on both units is that they are synchronized with each other, the system determines that this is the case. In the event of a single storage unit failure while the operating system is up and running, where all other devices operate properly, the operating system will recognize that the non-failing unit alone has current data, and record this new state information on the non-failing unit. When re-initialized after repair, the state information on the non-failing unit will be that it alone has current data, while the failing unit's state record may indicate that both units are synchronized or some unknown state. The operating system is able to determine in this situation that only the non-failing unit contains current data.

However, during re-initialization of the system, it is not uncommon for one of a mirrored pair of units to report that both units are synchronized, while the other unit does not respond. In this case, the system can not determine the state of the mirrored pair with certainty. It is possible that both units were synchronized when the system was powered down, as claimed by the responding unit. But the same situation can arise, for example, when the 'A' unit fails, is repaired without loss of its obsolete data, the system is re-initialized, and the 'B' unit does not respond. Note that a failure to respond during re-initialization does not necessarily mean that a storage unit is broken. The power switch may be off, or any number of other circumstances may prevent the unit from responding, particularly where a repair action has taken place while the system was powered down.

In the above mentioned situations, the operating system will either be unable to make a state determination, or will guess, possibly making an incorrect state determination. If the operating system is unable to make a state determination, it will generally query the user for the correct state. Because there may be a large number of storage units, and the association of logical address to physical location will not necessarily be obvious, querying the user is a very unreliable method of determining state. Guessing the state or just not knowing the state are both clearly undesirable for a mirrored or fault tolerant computer system, since the user does not receive the reliability and availability he expects.

It is therefore an object of the present invention to provide an enhanced method and apparatus for determining the state of a mirrored pair of data storage units.

It is a further object of this invention to provide an enhanced method and apparatus for determining the state of a mirrored pair of data storage units where multiple device failures occur.

It is also an object of this invention to provide greater redundancy and reliability in information tracking the state of mirrored storage units of a data processing system.

Another object of this invention is to provide a method and apparatus for determining the state of a mirrored pair of data storage units which is less prone to human error.

SUMMARY OF THE INVENTION

A data processing system having a pair of mirrored storage units maintains a record of the state ("state record") of the mirrored pair in system memory. In order to be able to determine state when the system is re-initialized, this state information is also stored in separate state records, one on each storage unit of the mirrored pair. The state of the mirrored pair is also stored in an alternate state record in an alternate location. In a preferred embodiment, the alternate state record is stored in non-volatile RAM. When the state changes, the operating system writes the new state to those storage units which are still functioning, and to the alternate state record. In order to prevent ambiguous situations, only certain defined state transitions are permitted.

When the system is re-initialized, it attempts to read the state information stored on the storage units. If either unit can not be read, the system retrieves the state from the alternate record, and substitutes the state retrieved from the alternate state record for the state that would have been read from the non-responding unit. The pair of states read from the two units (or substituted from the alternate state record) index a unique entry in a state derivation table. The entry contained at the location indexed by the two retrieved states is the true current state of the mirrored pair of storage units, which is then loaded into memory for system operation.

In a preferred embodiment, the system may contain multiple pairs of mirrored storage units. One pair is designated the "load source", and contains data necessary for re-initializing the system. Each unit of the load source pair will contain a state record called a "Device Configuration Table". The Device Configuration Table on the load source units contains the states of all configured storage units on the system. The alternate state record contains the state of the load source pair, but not of the other storage units. When the system is re-initialized, it determines the state of the load source pair as described in the preceding paragraph. Once the state of the load source pair is known, the states of the remaining devices can be obtained directly from the Device Configuration Table on any current load source unit.

BRIEF DESCRIPTION OF THE DRAWINGS

FIG. 2 is a diagram of a Device Configuration Table contained on one of the storage units or in main memory;

FIG. 3 is the State Derivation Table used to determine the state of a mirrored pair of storage units in accordance with this invention;

DETAILED DESCRIPTION OF THE PREFERRED EMBODIMENT

Figure 1:
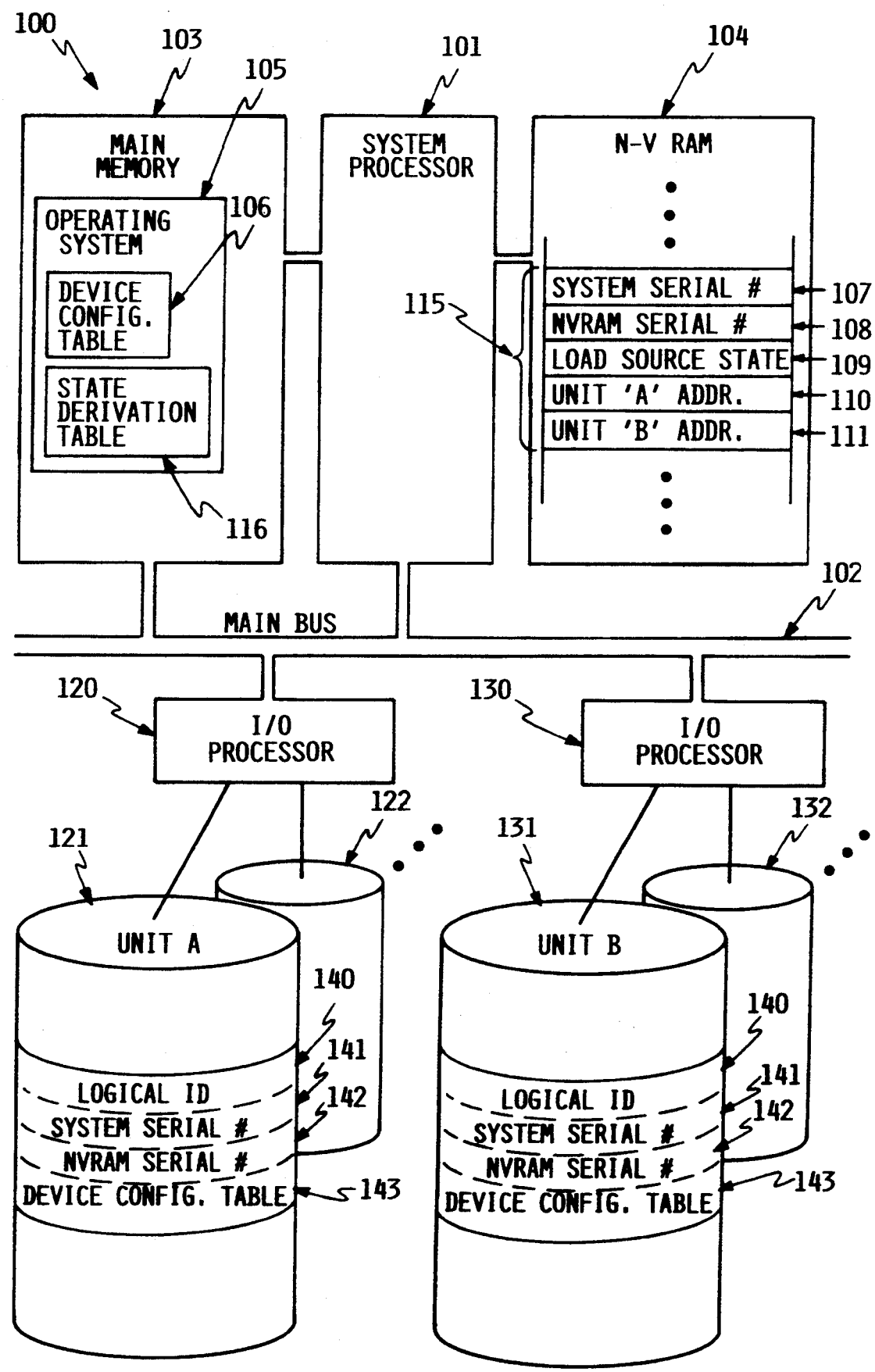
FIG. 1 is a block diagram of a system incorporating the mirrored storage components of the present invention.

A block diagram of the major components of computer system 100 of the preferred embodiment of the present invention is shown in FIG. 1. A system processor 101, suitable programmed as shown in FIG. 4, communicates over the system bus 102 with one or more I/O processors 120,130. Main memory 103 is coupled to system bus 102 and directly to system processor 101. During normal operations, operating system 105 containing Device Configuration Table 106 and State Derivation Table 116 resides in main memory 103. Non-volatile RAM 104, containing system critical data, is coupled to system processor 101. The non-volatile RAM 104 contains alternate state record 115 of the mirrored unit state of the load source units. Alternate state record 115 comprises a system serial number 107, the mirrored unit state of the load source units 109, the I/O address of load source unit 'A' 110, and the I/O address of load source unit 'B' 111. Non-volatile RAM 104 may optionally contain the serial number of the non-volatile RAM circuit card itself 108. The I/O processors 120,130 are attached to one or more storage units 121,122,131,132. In the preferred embodiment, storage units 121,122,131,132 are magnetic disk drive units, but could be any storage unit such as optical disk, tape, etc. Storage unit 'A' 121 and storage unit 'B' 131 constitute a single mirrored pair, and contain storage for the same data. In the preferred embodiment, unit 'A' 121 and unit 'B' 131 are attached to separate I/O processors 120 and 130, thereby increasing system redundancy. However, the units could be attached to the same processor. Although two I/O processors 120,130 are shown, it should be understood that the system may contain more than two I/O processors, or may contain only one I/O processor. It should also be understood that the number of storage units attached to an I/O processor is variable. In the preferred embodiment, computer system 100 is an IBM AS/400 computer system, although any computer system could be used.

Each storage unit 121,122,131,132 contains a logical identifier 140, a system serial number 141, and a state record called a Device Configuration Table 143. Logical identifier 140 identifies the disk unit to the system. System serial number 141 is the serial number of the system to which the unit is attached. In an alternate embodiment, the disk units also contain the serial number 142 of the non-volatile RAM circuit card 104.

The Device Configuration Table is shown in more detail in FIG. 2. It contains information identifying the storage configuration and state of the storage units. Each storage unit contains a complete Device Configuration Table, having entries for all the storage units attached to the system. Each record 201,202 in the Table corresponds to a pair of mirrored disk units, or a single unmirrored unit. The Table is indexed by a logical unit number 210 of the mirrored pair or single unmirrored unit. In the preferred embodiment, logical unit number 1 is reserved for the load source pair or unit. The remaining logical unit numbers are arbitrary. The logical unit number, when concatenated with an 'A' or 'B' designation, constitutes the logical identifier 140 of a disk unit. In addition to the logical unit number 210, each record is divided into three subrecords as shown in FIG. 2: a common data subrecord 211, a subrecord 212 for data peculiar to unit "A" of the pair, and a subrecord 213 for data peculiar to unit "B". The common data subrecord 211 contains a mirrored flag 215 and a mirrored unit state 214. The mirrored flag 215 is a single bit field used to indicate whether the record is for a pair of mirrored disk units or a single unmirrored unit; a '1' indicates that the record is a pair of mirrored units. The mirrored unit state 214 is a one-byte field indicating the current state of the mirrored pair. If the mirrored flag is set to '0' (not mirrored), the mirrored unit state is ignored. In the example shown in FIG. 2, record 201 for logical unit number 1 is of a mirrored pair of disk units, in which the current state is both units are functioning normally; record 202 for logical unit number 3 is of a single unmirrored disk unit. Since each unit number has its own entry in the Device Configuration Table indicating whether it is one of a mirrored pair, it is possible to mirror all, some or none of the disk units on a particular system. The subrecords 212,213 for unit 'A' and unit 'B' each contain an I/O address field 216,218 and a unit serial number 217,219 of their respective disk units. If the record is of a single unmirrored disk unit, as shown for record 202, the information for the unit is stored in the unit 'A' subrecord 212, and the unit 'B' subrecord 213 is not used. It should be understood that subrecords 211, 212 and 213 may contain additional fields used for other purposes.

There are five possible states which may be stored in the mirrored unit state field 214 of the Device Configuration Table. These states and their associated meanings are:

ABOK—Both 'A' and 'B' units of the mirrored pair are synchronized with current data
AOK—Only the 'A' unit contains current data; the 'B' unit is unreliable.
BOK—Only the 'B' unit contains current data; the 'A' unit is unreliable.
AOKRB—The 'A' unit contains current data, and the 'B' unit is in the process of being re-synchronized with the 'A' unit.
BOKRA—The 'B' unit contains current data, and the 'A' unit is in the process of being re-synchronized with the 'B' unit.

The system will not store an "unknown" state in the mirrored unit state field.

During normal system operation, the operating system maintains a copy of the Device Configuration Table in main memory 103 (FIG. 1), to which it refers when state information regarding the storage units is needed. When there is any change in the state of a storage unit, the new state is written to the Device Configuration Table in memory and the Device Configuration Table on each operational storage unit. If the state change involves a load source disk unit, the new state is also written to non-volatile RAM 104. In order to prevent the system from going into an indeterminate state, the following rules must be observed when changing states:

1. The system must never allow both units of a mirrored pair to be back level. If both units fail, the system shuts itself down. In this case, the last unit to fail will contain current data.
2. The system must never attempt to write a new mirrored state to a disk unit that fails.
3. Only the following state transitions are permissible:
   ABOK to AOK—(B unit fails)
   ABOK to BOK—(A unit fails)
   AOKRB to AOK13 (Attempt to re-synchronize B unit fails)
   BOKRA to BOK—(Attempt to re-synchronize A unit fails)
   AOK to AOKRB—(Start re-synchronizing B unit)
   BOK to BOKRA—(Start re-synchronizing A unit)
   AOKRB to ABOK—(Successful re-synchronization of B unit)
   BOKRA to ABOK—(Successful re-synchronization of A unit)

When computer system 100 is re-initialized, it first derives the mirrored unit state of the load source pair from the mirrored state data on the two load source units and in non-volatile RAM. A state is associated with each of the load source units. The state "associated with" a load source unit is the state stored on that unit if it can be read, or the state stored in alternate state record 115 in non-volatile RAM 104 if the state stored on the storage unit can not be read. There exists a unique resultant state of the mirrored load source pair corresponding to each pair of a state associated with the 'A' unit and a state associated with the 'B' unit. This resultant state is the true state of the load source pair, and is defined by the State Derivation Table 301 shown in FIG. 3. The State Derivation Table 301, which is stored 116 in the operating system 105 in main memory 103, requires an input associated with load source unit A 302, and an input associated with load source unit B 303. The system derives the state of the mirrored load source pair by accessing the entry in the table at the column corresponding to the state associated with unit A and the row corresponding to the state associated with unit B. The input states marked 'Unknown' 304,305 are not read from the disk unit or non-volatile RAM, but are used only when neither the disk unit nor non-volatile RAM can be read. The entries in the table marked with an "*" are not possible. The entries marked "*AOK" and "*BOK" are not possible when using the state read from the disk units, but are possible when using the state from non-volatile RAM for a non-responding disk unit. The entries marked "AOK" and "BOK" occur only for the state transitions from BOKRA to ABOK with B failing or from AOKRB to ABOK with A failing, respectively; computer system 100 recognizes and handles this 2-step transition.

As an example of the use of State Derivation Table 301, if unit 'A' contains the state 'ABOK', and unit 'B' does not respond, and non-volatile RAM contains the state 'BOK', the system will substitute the state 'BOK' read from non-volatile RAM for the state that would have been read from the 'B' unit. Putting these values into the table, the resultant state is contained at column 'ABOK' and row 'BOK'. This resultant state is 'BOK'. This is the situation results when the 'A' unit fails, its data becomes obsolete, the system is powered down, the 'A' unit is restored to operation, and the 'B' unit fails to respond when the system is re-initialized.

Figure 4A:
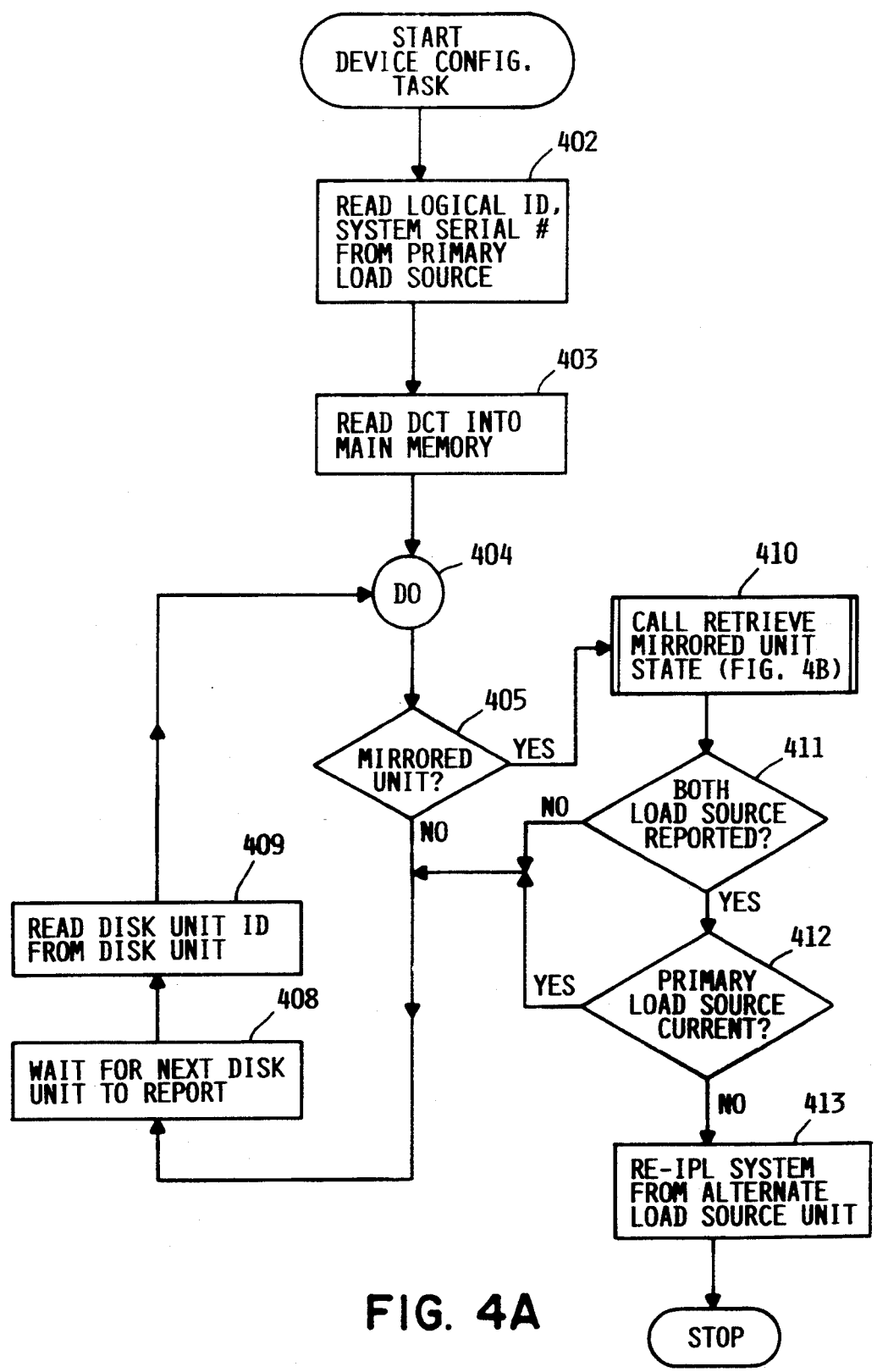
FIGS. 4A-4G are a flow diagram of the steps required to determine the state of the storage units attached to the system when the system is re-initialized.

FIGS. 4A–4G depict in detail the steps of the re-initialization procedure ("IPL") according to the present invention. FIG. 4A shows the device configuration task. This process begins by reading the storage unit logical identifier from one of the load source units 402. The load source unit which is accessed in this initial step is herein designated the primary load source unit. The primary load source unit in the preferred embodiment is the unit which responds first to a poll, and could be either the logical 'A' or logical 'B' unit. The process then loads the Device Configuration Table ("DCT") from the primary load source unit into main memory at 403. The process then enters a loop at 404 to determine the state of all units. Storage units report in a random pattern as they are brought on line. The process waits for each unit to report in 408, obtains the logical identifier of the reporting unit at 409, and calls a Retrieve Mirrored Unit State routine at 410 if the unit is one of a mirrored pair 405.

The Retrieve Mirrored Unit State routine 410 returns the state of the reporting unit based on the information then available to the system. On return from the routine 410, if both load source units have reported 411, and it the called subroutines have returned a state for the load source pair indicating that the primary load source does not contain current data 412, the system will re-start its re-initialization procedure at 413, using the alternate load source unit. Otherwise, it will return to the loop 404.

Figure 4B:
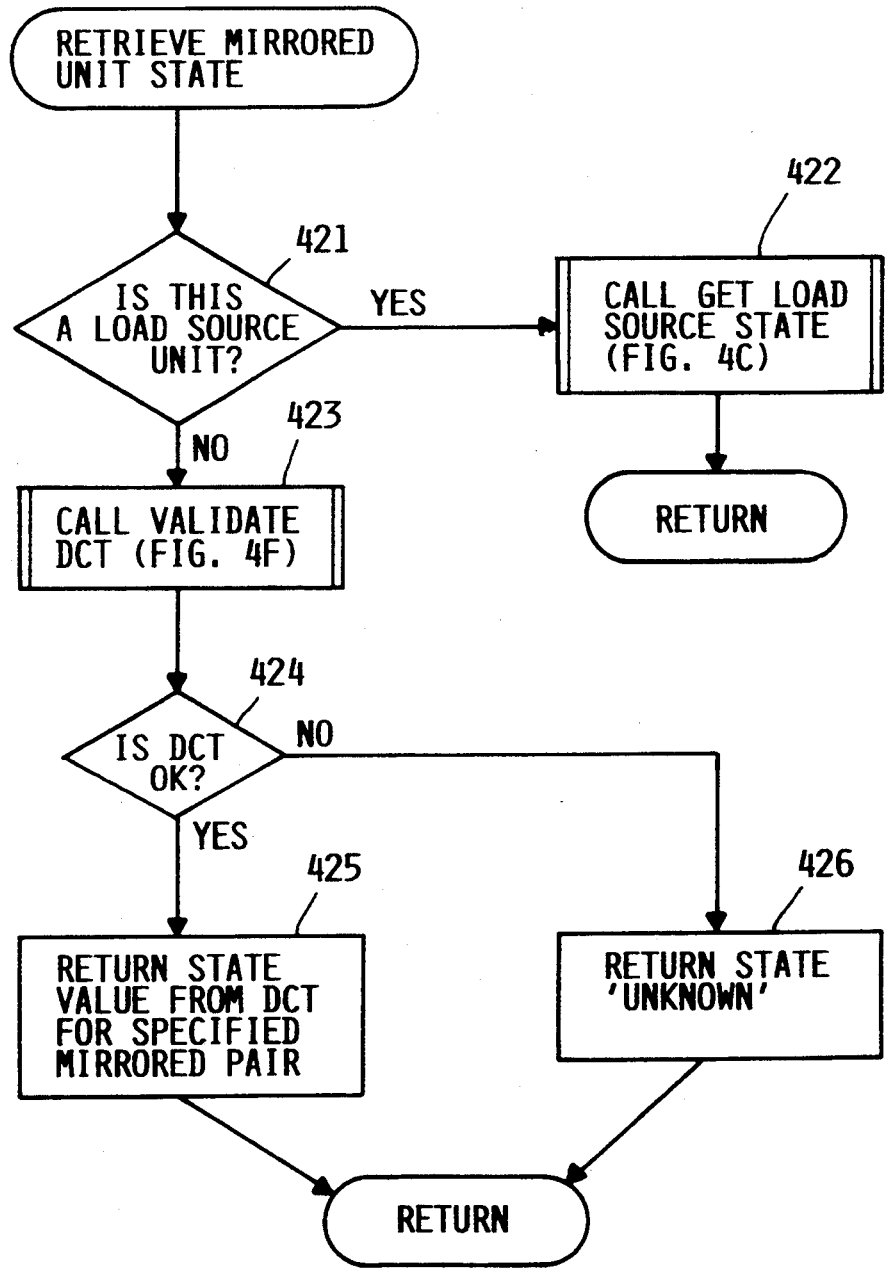

The retrieve mirrored unit state routine 410 is shown in detail in FIG. 4B. The routine branches 421 to a Get Load Source State routine 422 if the unit is a load source unit; otherwise it calls a Validate Device Configuration Table routine 423. If the Validate DCT routine returns DCT valid 424, the retrieve mirrored unit state routine 410 returns the state value of the mirrored pair stored in the DCT 425; otherwise it returns state not known 426.

Figure 4C:
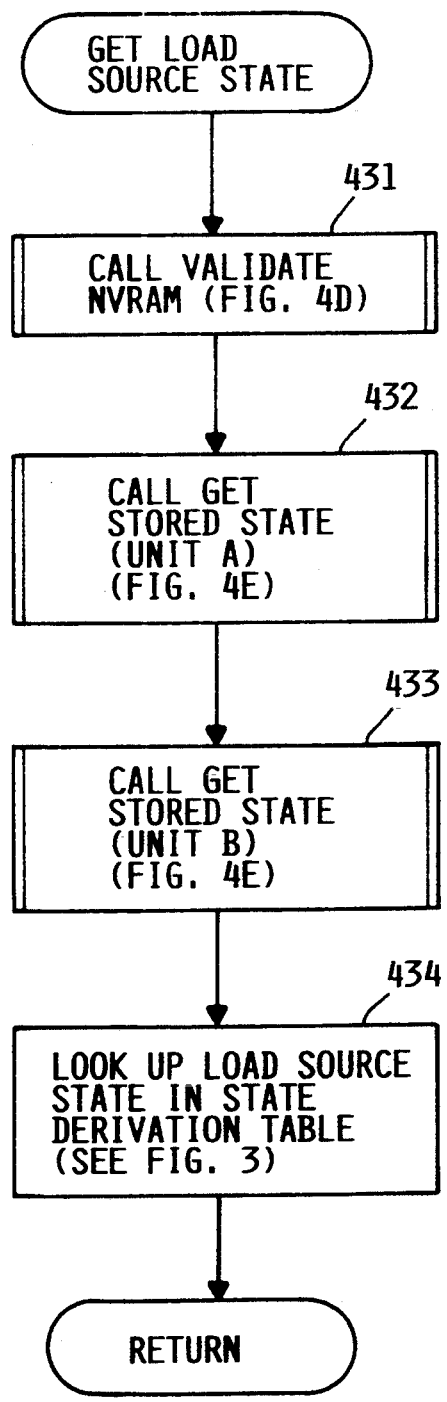

The Get Load Source State routine called at 422 is shown in FIG. 4C. It successively calls a Validate NVRAM routine 431, a Get Stored State routine 432 for disk unit A, a Get Stored State routine for disk unit B 433, and accesses the State Derivation Table 301 to derive the load source state from the states returned from the two calls to the Get Stored State routine. These returned state values are the states associated with the load source A and B units.

Figure 4D:
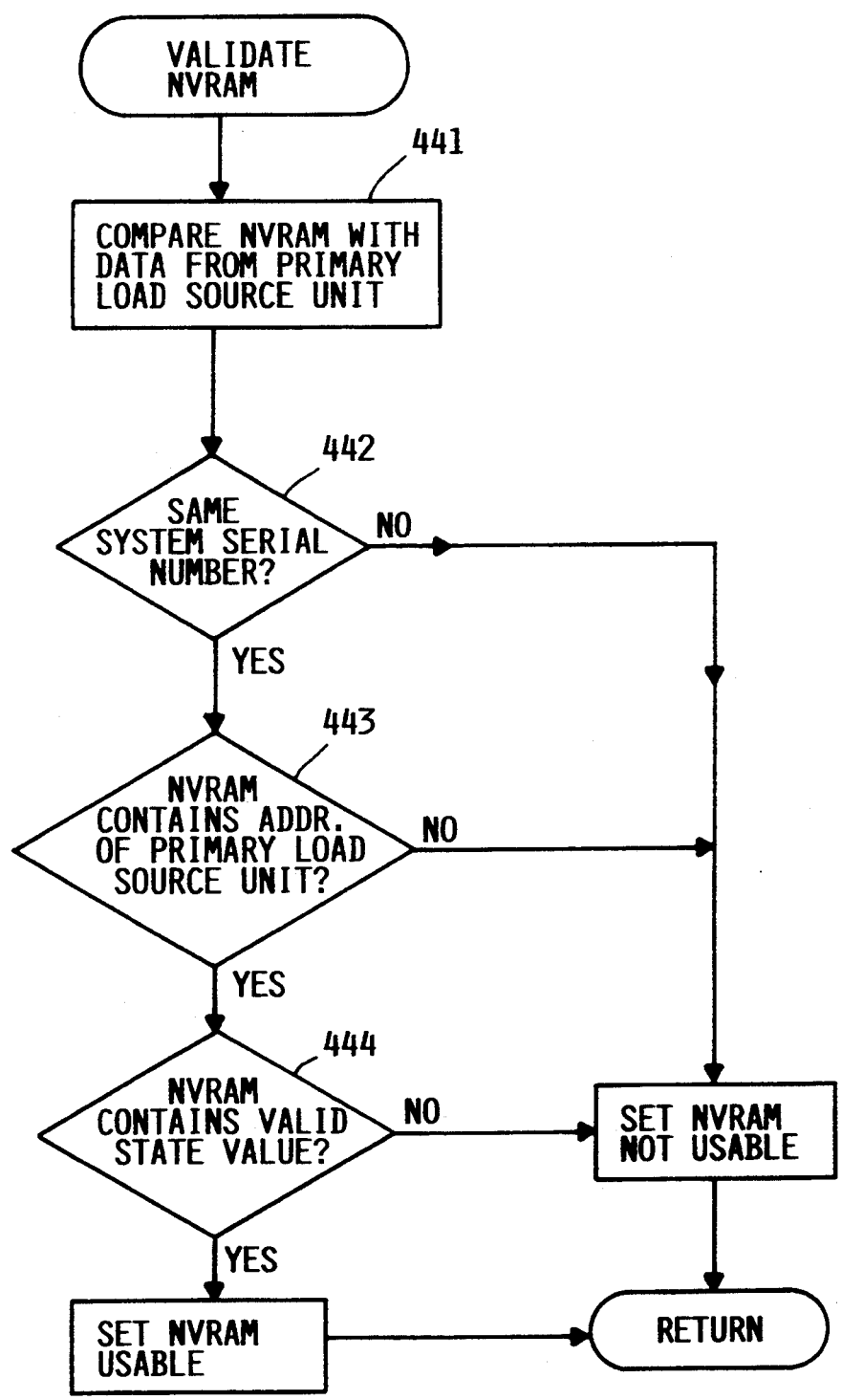

The Validate NVRAM routine is shown in FIG. 4D. This routine performs simple validity checks and sets a flag indicating NVRAM usable or not usable. One reason for performing this validation is that the non-volatile RAM unit (in this case, a circuit card) may have been replaced; it is for this reason that it is imprudent to rely on NVRAM alone to determine the state of the load source units. The routine compares the data in NVRAM with the data read from the primary load source disk unit 441. If the NVRAM and the primary load source unit do not contain the same system serial number 442, or the same I/O address of the primary load source unit 443, the NVRAM is not considered usable. In addition, if the NVRAM contains an invalid value for the state of the load source units 444, it is not usable.

Figure 4E:
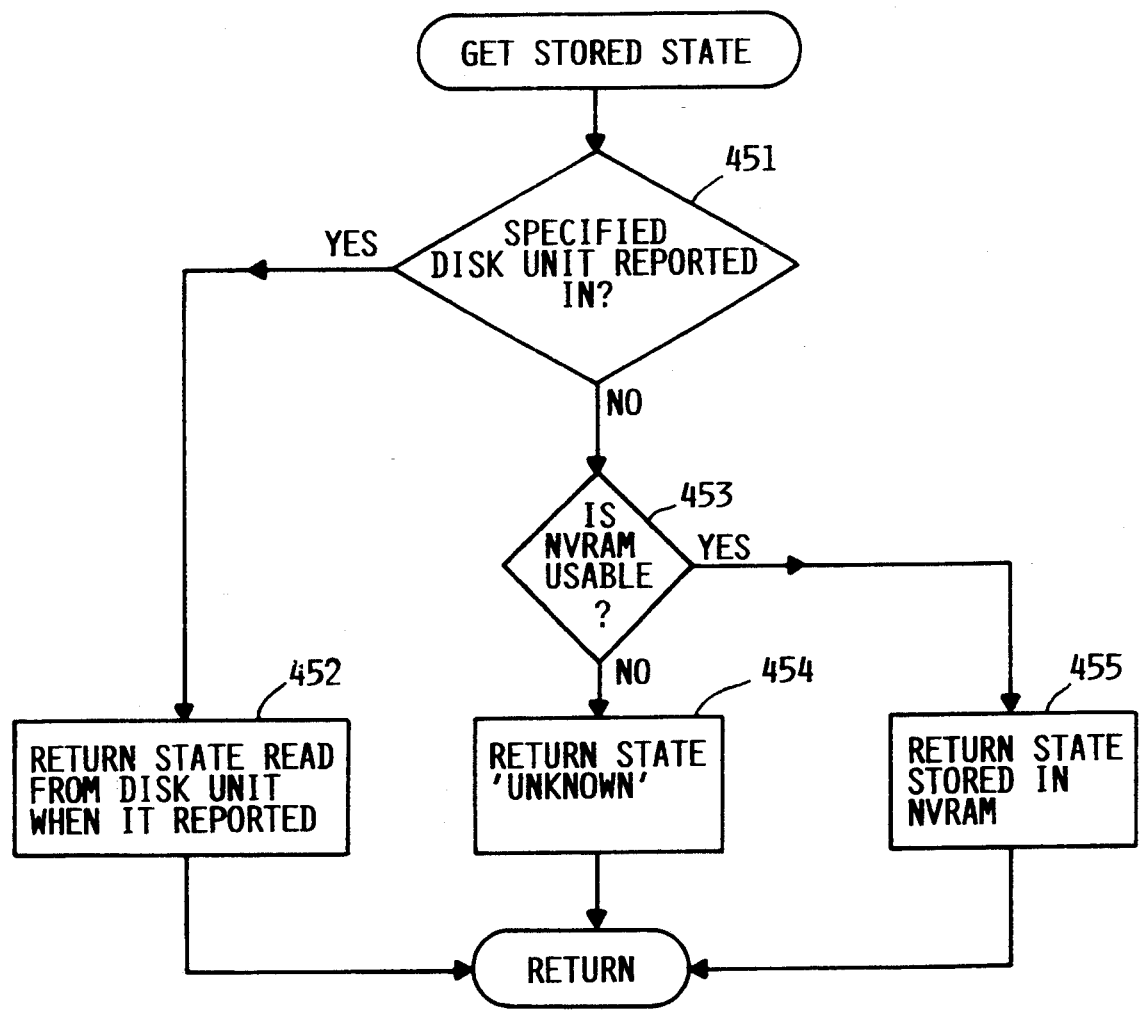

The Get Stored State routine called at 432 and 433 is shown in FIG. 4E. If the specified disk unit has reported in, it branches at 451 to return the state that was read from the disk unit when it reported in 452. If the unit has not reported, it checks whether NVRAM is useable 453. If NVRAM is usable, it returns the state stored in NVRAM 455; otherwise it returns "state unknown" 454.

Figure 4F:
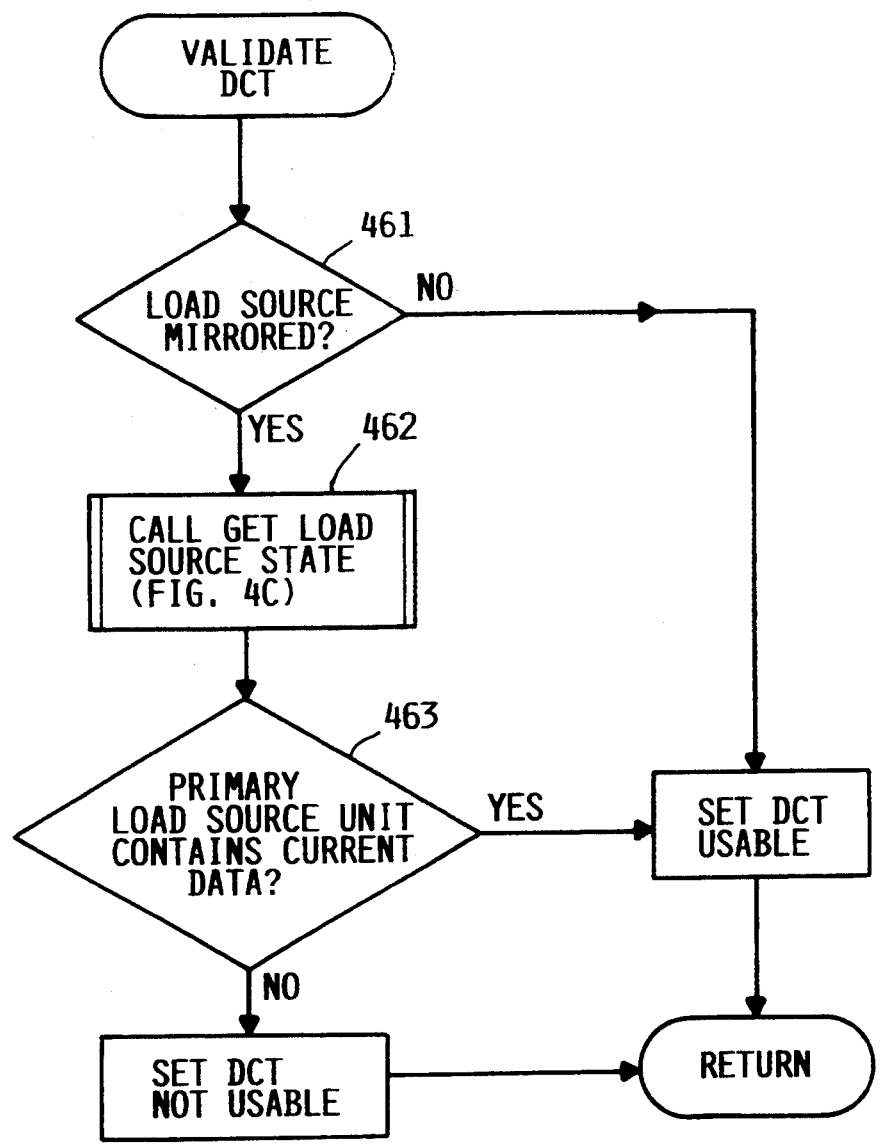

The Validate DCT routine called at 423 is shown in FIG. 4F. The routine sets a flag indicating whether the DCT is usable or not. If the load source is not a mirrored pair, the routine immediately branches 461 to set DCT usable. Otherwise, it calls the Get Load Source State routine at 462 to obtain the state of the primary load source device. This is the device from which the DCT table was originally loaded into memory. If the Get Load Source routine returns a state indicating that the primary load source device has current data, the process branches 463 to set DCT usable; otherwise it sets DCT not usable. It then returns to the calling routine.

Figure 4G:
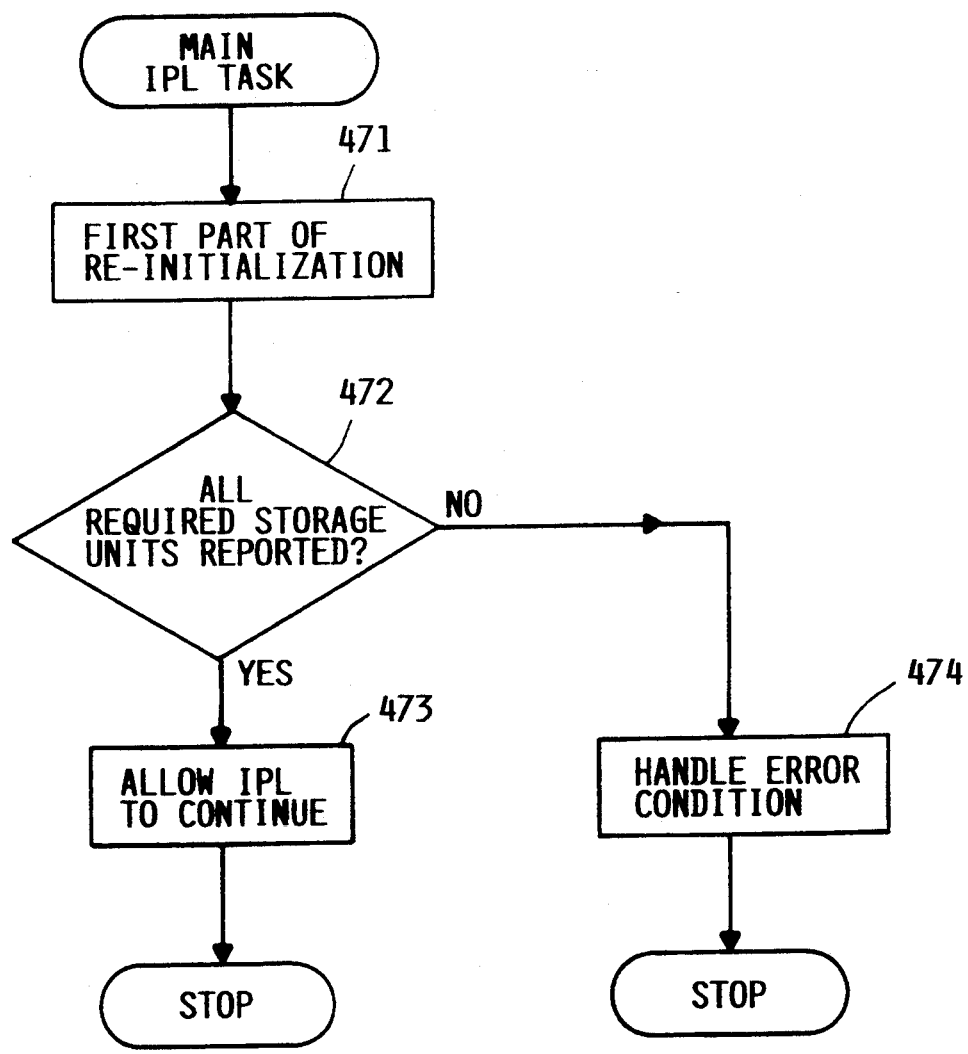

The Device Configuration Task shown in FIG. 4A continues to run indefinitely. Concurrently, the Main IPL Task shown in FIG. 4G is started. After the first part of the IPL task 471 completes, the task checks whether all required storage units have reported 472, i.e., at least one storage unit containing current data for all the stored data on the system. If so, IPL is allowed to continue 473; otherwise, an error handling routine is called.

By way of example, if the system is functional in all respects and both load source units contain current data, but the 'B' units is powered off, the system would perform the following steps. It would enter the Device Configuration Task and read the identifier, system serial 402 and DCT 403 from unit 'A'. Since unit 'A' is mirrored 405, it would call Retrieve Mirrored Unit State 410. It would branch at 421 to call Get Load Source State 422. Get Load Source State would call Validate NVRAM 431, which would set NVRAM valid and return. It would then call Get Stored State for unit A 432, which would return the state of 'ABOK'. It would then call Get Stored State for unit B 433. Because unit B has not reported in 451, and NVRAM is usable 453, it will return the state in NVRAM, which will be 'ABOK'. Get Load Source State would then look up the resultant state in the State Derivation Table 434, which would be 'ABOK'. It then returns to Retrieve Mirrored Unit State (FIG. 4B), which returns to the device configuration task (FIG. 4A). Since both load source units have not reported 411, the task returns to the loop 404 and waits for the next unit to report 408. It will then continue receiving status from the remaining units. After sufficient time has elapsed, the Main IPL Task, which has been performing other work 471, will check whether there is at least one current unit for all data on the system 472. Since the 'A' unit has been determined to be current, it will allow IPL to continue 473.

In the preferred embodiment, the system is designed so that any arbitrary set of storage units may be mirrored. It is, for example, possible to mirror some of the units, but not mirror the load source unit. However, this approach means that the sole source of mirrored state information when re-initializing is the single load source unit, losing much of the redundancy offered by mirrored storage. Therefore, it is recommended that the user mirror the load source unit.

The complete Device Configuration Table is stored on all disk units. The copies of the Table on units other than the load source units are not used in the re-initialization procedure described above, and exist only for archival purposes. In an alternate embodiment, it would be possible to use these copies of the DCT in place of the load source state stored on non-volatile RAM. In a further alternative embodiment, it would be possible to individually determine the state of each mirrored pair of disk units using the same procedure that is used to determine the state of the load source units, rather than rely on the DCT in the load source units for the state information of all other units. Since the units are brought on line and report in in a random fashion, an additional alternative embodiment would be to apply the state determination procedure to whichever mirrored pair reports first, and to then use the state information from the Device Configuration Table on one of the current units of the first reporting mirrored pair to determine the states of the remaining mirrored pairs.

The preferred embodiment stores the alternate state record in non-volatile RAM. This record may alternatively be stored in any location other than the two load source units, provided that the data persists when the system is powered down. It could, for example, be stored on a third disk storage unit of the same type as the load source units, on tape, or even on some other computer system remotely or directly connected to computer system 100.

In an additional alternate embodiment, the serial number of the non-volatile RAM unit can be stored in the non-volatile RAM itself and on the disk units. These serial numbers can be compared in the Validate NVRAM routine for an additional level of redundancy in validating non-volatile RAM.

Although a specific embodiment of the invention has been disclosed along with certain alternatives, it will be recognized by those skilled in the art that additional variations in form and detail may be made within the scope of the following claims. In particular, while the disclosed preferred embodiment employs magnetic disk storage units, the invention is applicable to a variety of storage device technologies, such at optical disks and magnetic tape.

What is claimed is:

1. A method for determining true current state of a mirrored pair of data storage units in a data processing system, said method being performed automatically by said data processing system, said method comprising the steps of:
   attempting to retrieve a first state record from a first storage unit of said mirrored pair of storage units to obtain a state associated with said first storage unit, wherein the state associated with said first storage unit includes state information for the mirrored pair;
   attempting to retrieve a second state record from a second storage unit of said mirrored pair of storage units to obtain a state associated with said second storage unit, wherein the state associated with said second storage unit includes state information for the mirrored pair, and wherein at least one of the state associated with said first storage unit and the state associated with the second storage unit is different from the true current state of said mirrored pair;
   retrieving an alternate state record from a location in said data processing system other than said first storage unit and other than said second storage unit;
   deriving a state associated with one of said first or second storage units from state information contained in said alternate state record if it is not possible to retrieve the state record from the respective storage unit; and
   determining the true current state of said mirrored pair from tile state associated with said first storage unit and the state associated with said second storage unit.

2. The method for determining true current state of a mirrored pair of data storage units of claim 1, wherein said step of determining the true current state of said mirrored pair comprises retrieving the true current state of said mirrored pair from an entry in a state derivation table, said state derivation table having a plurality of entries, each said entry corresponding to a respective pair of states, wherein said entry containing said true current state corresponds to the states associated with said first and second storage units.

3. The method for determining true current state of a mirrored pair of data storage units of claim 2, wherein said alternate state record is retrieved from non-volatile random access memory.

4. The method for determining true current state of a mirrored pair of data storage units of claim 1, wherein said alternate state record is retrieved from non-volatile random access memory.

5. A method for determining true current states of the mirrored pairs of data storage units in a data processing system having at least two mirrored pairs of storage units, said method being performed automatically by said data processing system, said method comprising the steps of:
   attempting to retrieve a first state record from a first storage unit of a first mirrored pair of storage units to obtain a state associated with said first storage unit, wherein the state associated with said first storage unit includes state information for the mirrored pair;
   attempting to retrieve a second state record from a second storage unit of said first mirrored pair of storage units to obtain a state associated with said second storage unit, wherein the state associated with said second storage unit includes state information for the mirrored pair, and wherein all least one of the state associated with said first storage unit and the state associated with said second storage unit is different from the true current state of said mirrored pair;
   retrieving an alternate state record from a location in said data processing system other than said first storage unit and other than said second storage unit;
   deriving a state associated with one of said first or second storage units from state information contained in said alternate state record if it is not possible to retrieve the state record from the respective storage unit;
   determining the true current state of said first mirrored pair from the state associated with said first storage unit and the state associated with said second storage unit of said first mirrored pair, said true current state indicating which units of said first mirrored pair contain current data; and
   retrieving the state of each mirrored pair of storage units other than said first mirrored pair from any storage unit of said first mirrored pair which is determined, by said step of determining the true current state of said first mirrored pair, to have current data.

6. The method for determining true current states of mirrored pairs of data storage units of claim 5, wherein said step of determining the true current state of said first mirrored pair comprises retrieving the true current state of said first mirrored pair from an entry in a state derivation table, said state derivation table having a plurality of entries, each said entry corresponding to a respective pair of states, wherein said entry containing said true current state corresponds to the states associated with said first and second storage units of said first mirrored pair.

7. The method for determining true current states of the mirrored pairs of data storage units of claim 6, wherein said alternate state record is retrieved from non-volatile random access memory.

8. The method for determining true current states of the mirrored pairs of data storage units of claim 5, wherein said alternate state record is retrieved from non-volatile random access memory.

9. A data storage apparatus for a data processing system having a mirrored pair of data storage units, comprising:

a first storage unit of said mirrored pair;

a second storage unit of said mirrored pair;

means for storing and retrieving a first state record, said first state record having state information for said mirrored pair, said first state record being stored on said first storage unit;

means for storing and retrieving a second state record, said second state record having state information for said mirrored pair, said second state record being stored on said second storage unit wherein at least one of the state information in the first state record and the state information in the second state record is different from true current state of said mirrored pair; and state determination means, accessing said means for storing and retrieving a first state record and accessing said means for storing and retrieving a second state record, for determining automatically and without input from an operator the true current state of said mirrored pair of data storage units when the data processing system is initialized, wherein said state determination means determines the true current state of said mirrored pair when the state record retrieved from one of the first or second storage units indicates that both storage units of said mirrored pair contain current data, and it is not possible to retrieve the state record from the other one of the first or second storage unit.

10. The data storage apparatus of claim 9, wherein said state determination means comprises means for substituting the state information contained in an alternate state record for the state information contained on one of the storage units in the event the state information contained on the storage unit can not be retrieved.

11. The storage apparatus of claim 10, wherein the state determination means further comprises a state derivation table having a unique state entry corresponding to each possible pair of a state associated with the first storage unit and a state associated with the second storage unit, whereby the true current state of said mirrored pair is determined by retrieving from said state derivation table the entry corresponding to the state associated with said first storage unit and the state associated with said second storage unit.

12. The data storage apparatus of claim 11, further comprising:

a third storage unit for storing data;

a fourth storage unit for storing a copy of the data stored on said third storage unit;

wherein said state determination means automatically determines the states of said third and fourth storage units using the information contained in the state records stored on said first and second storage units.

13. A data storage apparatus for a data processing system, comprising:

a first storage unit for storing data;

a second storage unit for storing a copy of the data stored on the first storage unit;

means for storing and retrieving a first state record, said first state record having state information for said data storage apparatus, said first state record being stored on said first storage unit;

means for storing and retrieving a second state record, said second state record having state information for said data storage apparatus, said second state record being stored on said second storage unit wherein at least one of the state information in the first state record and the state information in the second state record is different from true current state of said mirrored pair; and alternate state record substitution means, for substituting information contained in an alternate state record for the information contained in the state record of one of the storage units, when the state retrieval means is unable to retrieve the state information from the respective storage unit; and state determination means, coupled to the means for storing and retrieving a first state record and the means for storing and retrieving a second state record, and accessing the alternate state record substitution means, for determining automatically and without input from an operator, when the data processing system is initialized, the true current state of said data storage apparatus from the state associated with said first storage unit and the state associated with said second storage unit.

14. The data storage apparatus of claim 13, wherein the state determination means further comprises a state derivation table having a unique state entry corresponding to each possible pair of a state associated with the first storage unit and a state associated with the second storage unit.

15. The data storage apparatus of claim 14, wherein said alternate state record substitution means retrieves said alternate state record from non-volatile random access memory.

16. The data storage apparatus of claim 15, further comprising:

a third storage unit for storing data;

a fourth storage unit for storing a copy of the data stored on said third storage unit;

wherein the state determination means automatically determines the states of said third and fourth storage units using the information contained in the state records stored on said first and second storage units.

* * * * *